(12) United States Patent
Li

(10) Patent No.: US 9,208,944 B2
(45) Date of Patent: Dec. 8, 2015

(54) STANDARD CAPACITANCE BOX OUTPUT DEVICE

(76) Inventor: Guiying Li, Chengdu (CN)

( * ) Notice: Subject to any disclaimer, the term of this patent is extended or adjusted under 35 U.S.C. 154(b) by 144 days.

(21) Appl. No.: 13/881,763

(22) PCT Filed: Oct. 26, 2011

(86) PCT No.: PCT/CN2011/081358
§ 371 (c)(1),
(2), (4) Date: Apr. 26, 2013

(87) PCT Pub. No.: WO2012/055358
PCT Pub. Date: May 3, 2012

(65) Prior Publication Data
US 2013/0223040 A1  Aug. 29, 2013

(30) Foreign Application Priority Data

Oct. 27, 2010 (CN) .......................... 2010 2 0578897

(51) Int. Cl.
| | |
|---|---|
| *G01R 35/00* | (2006.01) |
| *H01G 2/10* | (2006.01) |
| *H01G 5/38* | (2006.01) |
| *H01G 4/38* | (2006.01) |
| *G01R 27/02* | (2006.01) |

(52) U.S. Cl.
CPC . *H01G 2/10* (2013.01); *H01G 4/38* (2013.01); *H01G 5/38* (2013.01); *G01R 27/025* (2013.01)

(58) Field of Classification Search
CPC ............. H01G 5/38; H01G 2/10; H01G 4/38; H01G 4/224; H01G 5/014
USPC .................................................. 361/328–330
See application file for complete search history.

(56) References Cited

U.S. PATENT DOCUMENTS 4,924,173 A    5/1990   Dishman

FOREIGN PATENT DOCUMENTS

| CN | 2524353 Y | 12/2002 |
|---|---|---|
| CN | 2676220 Y | 2/2005 |
| CN | 2831156 Y | 10/2006 |
| CN | 201828656 U | 5/2011 |
| GB | 1433336 A | 4/1976 |
| JP | 04-209512 A | 7/1992 |

*Primary Examiner* — Ramon Barrera
(74) *Attorney, Agent, or Firm* — Mei & Mark LLP

(57) ABSTRACT

The invention discloses a capacitance standard box output device. The number of standard capacitors is reduced, so that the structure of a changeover switch is simplified, and the number of connection wires is reduced, so as to improve the shield effect and reduce uncertainty. The technical proposal of the invention is as follows: The capacitance standard box output device comprises a changeover switch and precision capacitors, wherein the changeover switch is placed in a shield box; the shield box has an input terminal and an output terminal; the input terminal is connected to the changeover switch and the precision capacitor; the output is connected to the changeover switch and outputs the capacitance selected by the changeover switch; the selected capacitance is a product of a unit capacitance and an arbitrary integer value between 0 and 10; the number of the precision capacitors is from 4 to 9, and at least one capacitor is of a unit capacitance. The invention is mainly used for the capacitance standard box to output more accurate capacitance.

19 Claims, 4 Drawing Sheets

STANDARD CAPACITANCE BOX OUTPUT DEVICE

This is a §371 National Stage application of Patent Cooperation Treaty Application No. PCT/CN2011/081358, filed Oct. 26, 2011, which claims the benefit of priority of Chinese Application No. 201020578897.3, filed Oct. 27, 2010, all of which are incorporated herein by reference.

TECHNICAL FIELD OF THE INVENTION

The invention relates to a measurement and calibration technique of a capacitor, more particularly to a high-precision capacitance standard box output device.

TECHNICAL BACKGROUND OF THE INVENTION

In the measurement or calibration of a capacitor, traceability (values transfer) of capacitance parameters requires a high-precision capacitance bridge, or a high-precision single-value standard capacitor, or a high-precision capacitance standard box. Currently, the uncertainty of the Capacitance Standard Box is generally at 1%~0.05%; its capacitance range is within 1 pF~1 μF, and its zero capacitance is ≤0.005 pF. The uncertainty of the relatively good capacitance standard box can reach 0.05%. From the viewpoint of development and demand, the currently existing capacitance standard box with the uncertainty of 0.05% cannot meet the requirements of higher precision in practical application.

The capacitance standard box may have different decimal digits according to different output ranges. In addition that the connected standard capacitor at each decimal digit has different capacitance units, the decimal digit structures are the same. The capacitance standard box comprises a high-precision capacitor (or called as a standard capacitor), a changeover switch, an input terminal, an output terminal and a shield box. The uncertainty of the capacitance output from the capacitance standard box is mainly determined by the uncertainty of the standard capacitors and the changeover switch. According to the current technology, the uncertainty of the changeover switch is generally within 0.1%~0.01%. Plus the uncertainty of the standard capacitor itself and the uncertainty introduced from leading wires and an interface, the uncertainty of the output capacitance of the currently existing capacitance standard box cannot meet the requirement of 0.01% uncertainty.

The currently existing capacitance standard box with 1%~0.05% uncertainty used a decimal changeover switch and ten capacitors with the same capacitance. The different number of standard capacitors is selected to be connected in parallel through a changeover switch. Total 11 values of 0, 1, 2, . . . up to 10 capacitance values can be made up. For example, ten high-precision capacitors in 100 pF (this 100 pF is the unit-capacitance of this decimal. Please refer to the (C1~C10) in Table 1) are used as input; 11 output values are within 0-10 unit-capacitances; that is (0~10)×100 pF capacitances, and the error introduced by the changeover switch is within 0.1%~0.01%. FIG. 1 is a circuit diagram of a decimal of a capacitance standard box. The figure shows a circuit diagram, in which a changeover switch selected standard capacitances C=C1+C2+C3+C4 as output, and the capacitance is 4 of unit capacitance. The output capacitance between A and A' is 400 pF=4×100 pF. The output of any other capacitance from 0 to 1000 pF can be selected in a similar way. The selection between the output capacitance and the changeover switch is shown in Table 1.

In a capacitance standard box with the output range of 1~1000 pF, the unit capacitance of the first digit is 100 pF; the unit capacitance of the second digit is 10 pF, and the unit capacitance of the third decimal is 1 pF. If a standard capacitance of 893 pF is needed, the first digit of the capacitance standard box output is eight unit capacitances; its second digit output is nine unit capacitances, and its third digit output is three unit capacitances. Other output values can be made in the same way.

In the currently existing capacitance standard box, the main reasons of the relatively large error caused by the changeover switch are as follows:

1. As ten standard capacitors are needed to meet the requirements of eleven standard capacitance values, the structure of a changeover switch is complex; the distributed capacitance is relatively high; more leading wires at the input terminal is needed; the number of leading wires is 20; the distributed capacitance is introduced; terminals are not completely shielded, and hence error is introduced.

2. As a shield board between electrodes (a partition metal board in a shield box) is passed through by ten input wires, two relatively large holes are opened on the shield board, thereby causing the distributed capacitance between the electrodes increased, and hence introducing error.

3. As an output wire of the changeover switch does not use a shielded wire but a plain wire (a silver-plated copper wire); furthermore, two output interfaces are not completely shielded, and the distributed capacitance is introduced, the error is introduced.

4. As the shield box is made from a bolted metal sheet, which is poor shield to external electrical field and magnetic field, this will add in error.

Out of all above, first three are the main error sources, which are inherent in the structure of currently existing capacitance standard box.

SUMMARY OF THE INVENTION

The invention aims at disclosing a capacitance standard box output device. The number of standard capacitors is reduced, so that the structure of a changeover switch is simplified, and the number of leading wires is reduced, so as to improve the shield effect and reduce error.

The technical proposal of the invention is as follows: The capacitance standard box output device comprises a changeover switch and precision capacitors, wherein the changeover switch is placed in a shield box; the shield box has an input terminal and an output terminal; the input terminal is connected to the changeover switch and the precision capacitor; the output terminal is connected to the changeover switch and outputs the capacitance selected by the changeover switch; the selected capacitance is a product of an arbitrary integer value between 0 and 10 and a unit capacitance; wherein the number of the precision capacitors is from 4 to 9; among them, at least one of the precision capacitors is one unit capacitance.

Furthermore, both the input terminal and the output terminal adopt a shielded interface.

Furthermore, the shield box is made up by welding a metal sheet.

Furthermore, the shield box has a partition metal board in the middle. The partition metal board divides the shield box into two shielded rooms. The changeover switch is positioned at the two shielded rooms and connected to two electrodes of a standard capacitance respectively.

Preferably, the number of the precision capacitors is four.

Furthermore, the changeover is a ceramic band switch with a structure in ten layers, and two shielded rooms have five layers respectively.

Preferably, the capacitance of the four precision capacitors is 1, 2, 2 and 5 unit capacitances respectively.

Preferably, the capacitance of the four precision capacitors is 1, 2, 2 and 6 unit capacitance respectively.

Preferably, the capacitance of the four precision capacitors is 1, 1, 3 and 5 capacitances units respectively.

Preferably, the capacitance of the four precision capacitors is 1, 1, 3 and 6 capacitances units respectively.

The invention has the following beneficial effects: reducing the number of the standard capacitors; decreasing the complexity and distributed parameters of the structure of the changeover switch, and lowering the error of the capacitance standard box. As the number of the leading wires is reduced, the influence of the distributed capacitance introduced among the leading wires and the ruin caused by a through wire to a shielded structure are reduced, and the uncertainty of the capacitance standard box is further decreased. The invention can lower the uncertainty introduced by a changeover switch to less than 8 ppm (0.0008%), which fundamentally improved the accuracy of capacitance standard box. Moreover, as the number of the standard capacitors is reduced, the volume and weight of the capacitance box can be made smaller; these contribute to lower the cost and uncertainty.

DRAWINGS OF THE INVENTION

The invention is illustrated through examples and drawings, wherein.

EMBODIMENTS OF THE INVENTION

The technical proposal of the invention is described in details with drawings and embodiments in the following:

In the technical proposal of the invention, according to the characteristics of parallel output of a capacitance standard box, with a small number of the standard capacitors the capacitance standard box can meet the requirements of the capacitances in any integer within 0-10. As the number of the standard capacitors is reduced, the structure of a changeover switch is simplified; connecting wires can be reduced; the distributed parameters of the capacitance standard box are reduced, and the accuracy of the output capacitance is increased.

Example

Figure 1:
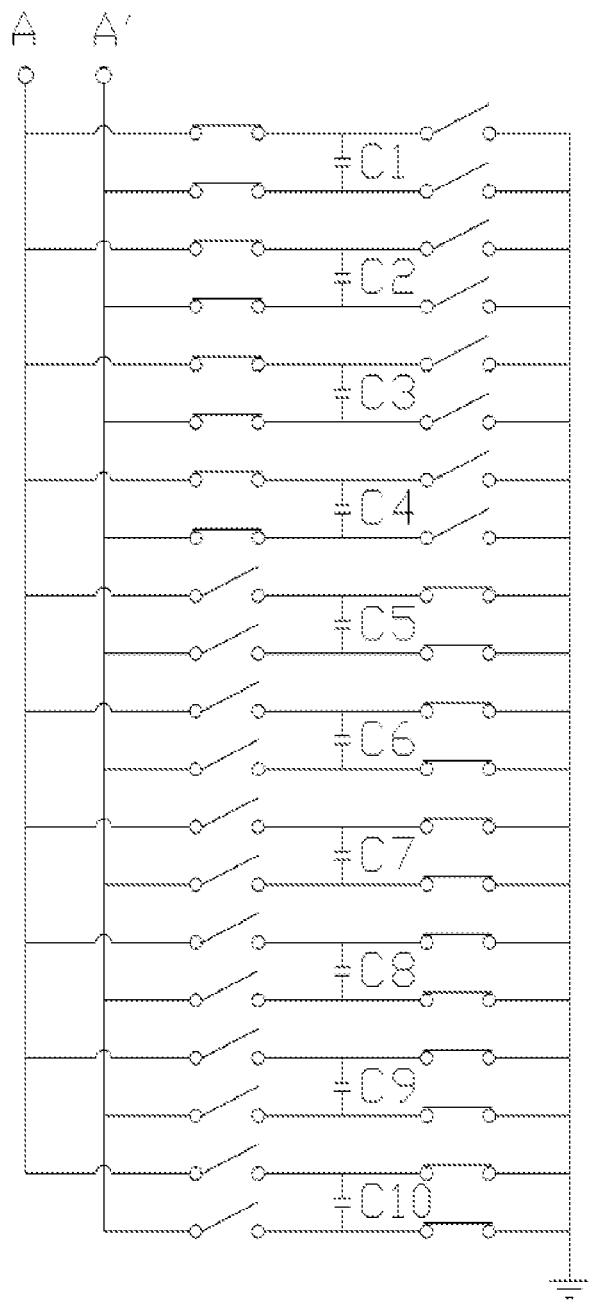
FIG. 1 is a circuit schematic diagram of a capacitance output in a capacitance standard box in the prior art.
Figure 2:
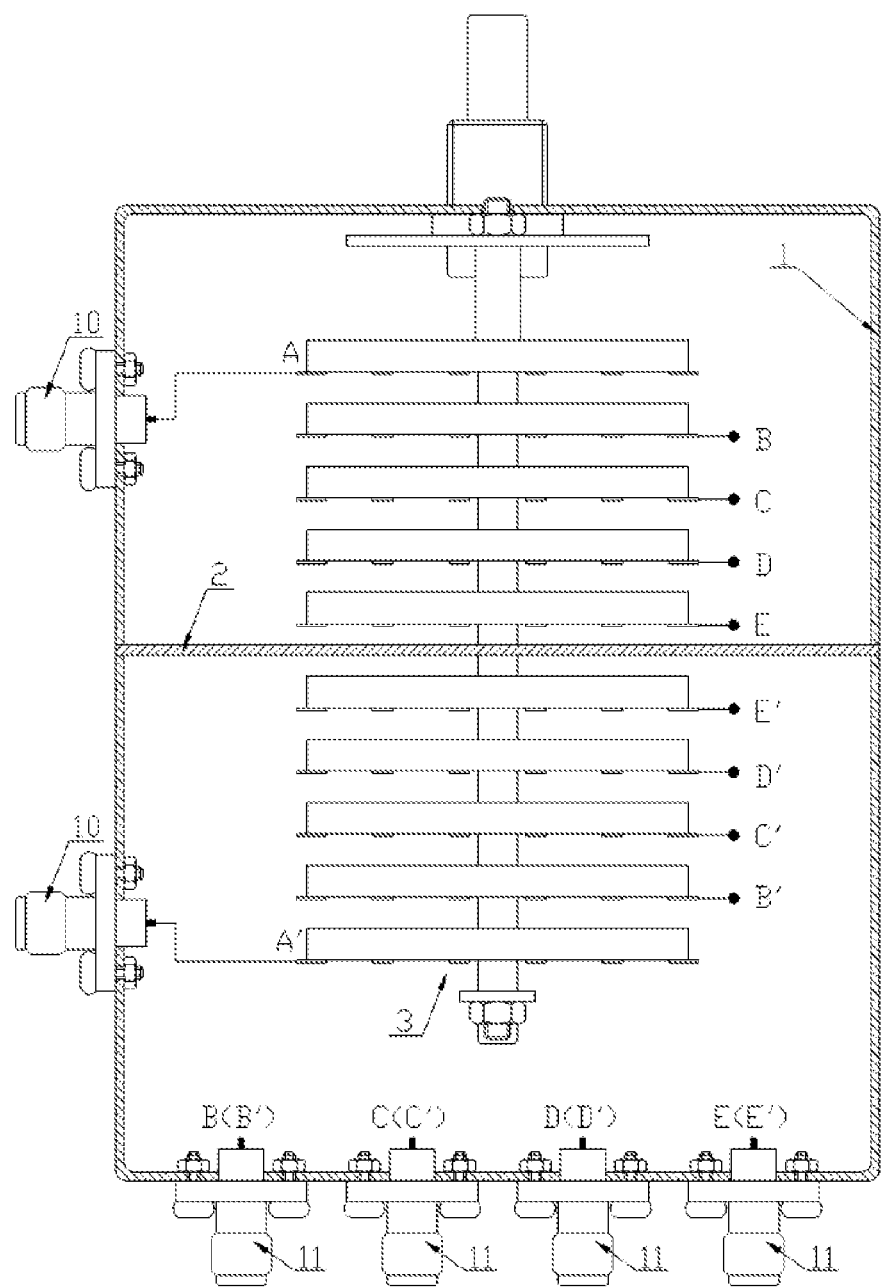
FIG. 2 is a diagram of a changeover switch and a shield box of embodiments of the invention.
Figure 3:
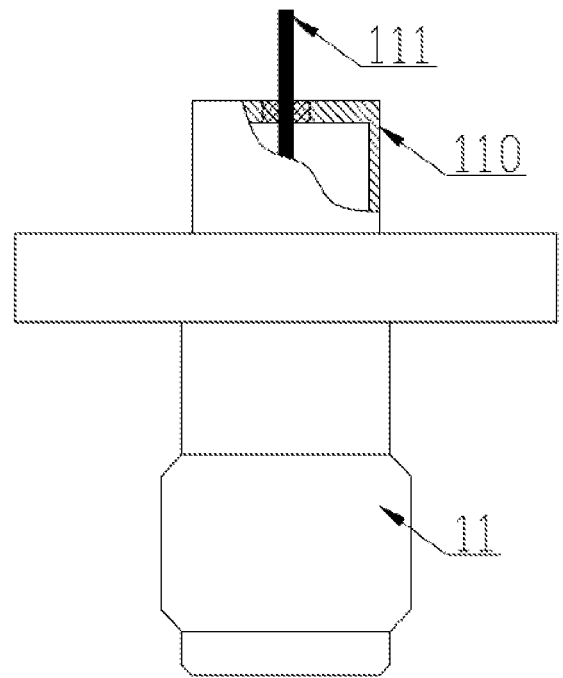
FIG. 3 is a structure diagram of a shielded interface of embodiments of the invention.

The structure of a capacitance standard box output device is shown in FIG. 2. The capacitance standard box output device comprises a switch 3, a shield box 1 and precision capacitors (not shown in FIG. 2). The changeover switch 3 is placed in the shield box 1. An input terminal 11 and an output terminal 10 are arranged on the shield box and both adopt a shielded interface, and the structure is shown in FIG. 3. Both of the input terminal 11 and the output terminal 10 adopt a shielded interface, and the structure is shown in FIG. 3. In the example, the connection between the input terminal 11 and a precision capacitor as well as the connection between the input terminal 11 and a changeover switch 3 both adopt a shielded wire. The connection between the output terminal 10 and the changeover switch 3 also adopts a shielded wire. The core of the shielded wire is connected with a core wire 111 of the shielded interface. The outer shield of the shielded wire is connected with the shell 110 of the shielded interface. The outer shell 110 of the shielded interface is connected with the shield box 1. The shield box 1 is connected with the ground of the capacitance standard box. The shield box 1 of this example consists of a welded metal sheet. Comparing with the shield box bolted by a screw, it has better shield effect. As shown in FIG. 2, a metal wall 2 is installed in the middle of shield box 1 in the example. The metal wall 2 divides the shield box 1 into two shielded rooms; therefore the changeover switch is divided by the metal wall 2 into two parts in two shielded rooms. Two parts are respectively connected with two electrodes of the standard capacitors. With this structure, two electrodes of the standard capacitors can be effectively separated, thereby reducing the influence of distributed parameters.

Figure 4:
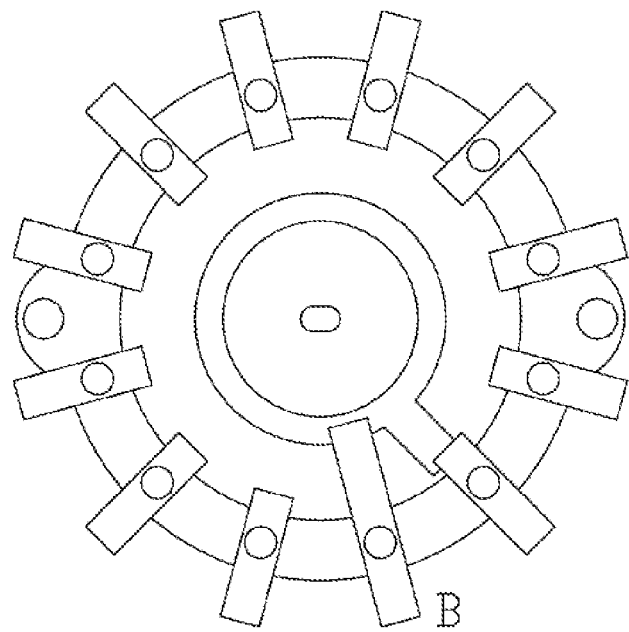
FIG. 4 is a structure drawing of one layer of a changeover switch of embodiments of the invention.
Figure 5:
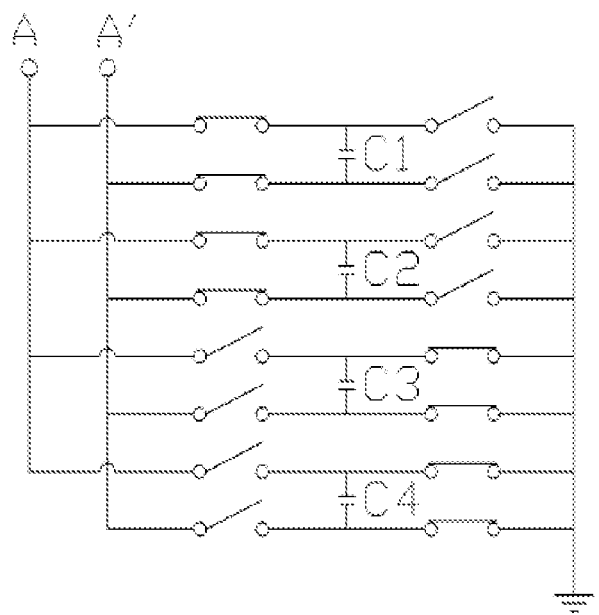
FIG. 5 is a circuit schematic diagram of the output of three unit capacitances (the selected standard capacitance is C1+C2)
Figure 6:
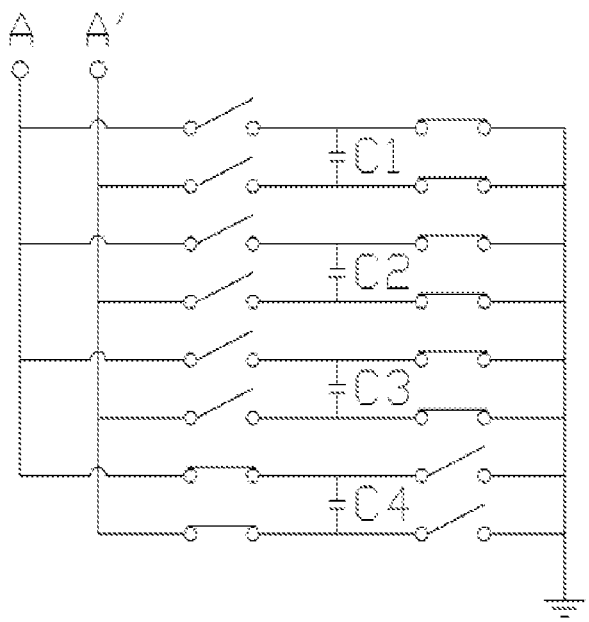
FIG. 6 is a circuit schematic diagram of the output of five unit capacitances (the selected standard capacitance is C4).

As shown in FIG. 2, in the shield box 1 of this Example, there are totally four groups of input terminals, which are respectively indicated as B, B'; C,C'; D,D' and E,E'. As FIG. 2 is perspective drawing, all of the input terminals B', C', D' and E' are concealed and labeled in brackets. The input terminals of four the groups are connected with four the standard capacitors respectively. The capacitances of four the standard capacitors in the example are 1, 2, 2 and 5 unit capacitances respectively (one unit capacitance is 100 pF. The followings are the same). Please refer to C1, C2, C3 and C4 in Table 2. The changeover switch, which matches with the capacitors, is a ceramic band switch with a ten-layer structure. There are five layers in two shielded rooms respectively. Each of the layers has the same structure. The structure shown in FIG. 4 is a single-pole 11-position switch (FIG. 4 shows the layer of a switch position marked as B). The layer of a switch position in each of two shielded rooms is connected to the output terminal 10 (such as the switch position A and A' in FIG. 2). All of the pole positions on the remaining four layers are connected to the standard capacitors (such as B, B', C, C', D, D', E and E'shown in FIG. 2). In FIG. 2, the switch positions are connected to the input terminals in the same labels. Through the selection of the changeover switch, the output capacitance of the output terminal 10 can be a product of a unit capacitance and an arbitrary integer value between 0 and 10, refer to FIG. 2. FIG. 5 shows a circuit schematic diagram that the output capacitance of the output terminals A and A' is three unit capacitances (3×100 pF). FIG. 6 shows a circuit schematic diagram that the output capacitance of the output terminals A and A' is five unit capacitances (5×100 pF).

Table 3 shows a selection relationship between the output capacitance and the input standard capacitor when the capacitances of four precision capacitors are 1, 2, 2 and 6 unit capacitances respectively.

Table 4 shows a selection relationship between the output capacitance and the input standard capacitor when the capacitances of four precision capacitors are 1, 1, 3 and 5 unit capacitances respectively.

Table 5 shows a selection relationship between the output capacitance and the input standard capacitor when the capacitances of four precision capacitors are 1, 1, 3 and 6 unit capacitances respectively.

If four precision capacitors are adopted to realize the output of 0-10 unit capacitances, there are also many different combination methods, which are shown in Tables 2-14. Similarly, if 5, 6, 7 and 9 standard capacitors are adopted, there are also many combination methods. If five standard capacitors are adopted, their capacitances can be 1, 2, 3, 4 and 5 unit capacitances. If nine standard capacitors are adopted, their capacitances can be 1, 1, 1, 1, 1, 1, 1, 1 and 2 unit capacitances, etc., details are not illustrated here for each of the cases. The technical proposal of the invention is that: with the reduced number of the standard capacitors, the distributed parameters are reduced and the accuracy of the high-capacitance standard box is increased. The less the number of the adopted standard capacitors is, the more obvious the effect is. However, in order to meet the requirement that the output capacitance is any integer of 0-10 unit capacitances, at least four standard capacitors are needed.

TABLE 1

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 100 pF | 0 | 1 | 1 | 1 | 1 | 1 | 1 | 1 | 1 | 1 | 1 |
| | C2 = 100 pF | 0 | 0 | 1 | 1 | 1 | 1 | 1 | 1 | 1 | 1 | 1 |
| | C3 = 100 pF | 0 | 0 | 0 | 1 | 1 | 1 | 1 | 1 | 1 | 1 | 1 |
| | C4 = 100 pF | 0 | 0 | 0 | 0 | 1 | 1 | 1 | 1 | 1 | 1 | 1 |
| | C5 = 100 pF | 0 | 0 | 0 | 0 | 0 | 1 | 1 | 1 | 1 | 1 | 1 |
| | C6 = 100 pF | 0 | 0 | 0 | 0 | 0 | 0 | 1 | 1 | 1 | 1 | 1 |
| | C7 = 100 pF | 0 | 0 | 0 | 0 | 0 | 0 | 0 | 1 | 1 | 1 | 1 |
| | C8 = 100 pF | 0 | 0 | 0 | 0 | 0 | 0 | 0 | 0 | 1 | 1 | 1 |
| | C9 = 100 pF | 0 | 0 | 0 | 0 | 0 | 0 | 0 | 0 | 0 | 1 | 1 |
| | C10 = 100 pF | 0 | 0 | 0 | 0 | 0 | 0 | 0 | 0 | 0 | 0 | 1 |

0: Unselected,
1: Selected

TABLE 2

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 1 | 0 | 0 | 1 | 0 | 1 | 0 | 1 |
| | C2 = 2 × 100 pF | 0 | 0 | 1 | 1 | 1 | 0 | 0 | 1 | 1 | 1 | 1 |
| | C3 = 2 × 100 pF | 0 | 0 | 0 | 0 | 1 | 0 | 0 | 0 | 0 | 1 | 1 |
| | C4 = 5 × 100 pF | 0 | 0 | 0 | 0 | 0 | 1 | 1 | 1 | 1 | 1 | 1 |

0: Unselected,
1: Selected

TABLE 3

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 1 | 0 | 1 | 0 | 1 | 0 | 1 | 0 |
| | C2 = 2 × 100 pF | 0 | 0 | 1 | 1 | 1 | 1 | 0 | 0 | 1 | 1 | 1 |
| | C3 = 2 × 100 pF | 0 | 0 | 0 | 0 | 1 | 1 | 0 | 0 | 0 | 0 | 1 |
| | C4 = 6 × 100 pF | 0 | 0 | 0 | 0 | 0 | 0 | 1 | 1 | 1 | 1 | 1 |

0: Unselected,
1: Selected

TABLE 4

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 1 | 0 | 1 | 0 | 1 | 1 | 0 | 1 | 1 |
| | C2 = 1 × 100 pF | 0 | 0 | 1 | 0 | 0 | 0 | 0 | 1 | 0 | 0 | 1 |
| | C3 = 3 × 100 pF | 0 | 0 | 0 | 1 | 1 | 0 | 0 | 0 | 1 | 1 | 1 |
| | C4 = 5 × 100 pF | 0 | 0 | 0 | 0 | 0 | 5 | 1 | 1 | 1 | 1 | 1 |

0: Unselected,
1: Selected

TABLE 5

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 1 | 0 | 1 | 1 | 0 | 1 | 1 | 0 | 1 |
| | C2 = 1 × 100 pF | 0 | 0 | 1 | 0 | 0 | 1 | 0 | 0 | 1 | 0 | 0 |
| | C3 = 3 × 100 pF | 0 | 0 | 0 | 1 | 1 | 1 | 0 | 0 | 0 | 1 | 1 |
| | C4 = 6 × 100 pF | 0 | 0 | 0 | 0 | 0 | 1 | 1 | 1 | 1 | 1 |

0: Unselected,
1: Selected

TABLE 6

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 0 | 1 | 0 | 1 | 0 | 0 | 1 | 0 |
| | C2 = 2 × 100 pF | 0 | 0 | 1 | 0 | 0 | 0 | 0 | 1 | 0 | 0 | 1 |
| | C3 = 3 × 100 pF | 0 | 0 | 0 | 1 | 1 | 0 | 0 | 0 | 1 | 1 | 1 |
| | C4 = 5 × 100 pF | 0 | 0 | 0 | 0 | 0 | 1 | 1 | 1 | 1 | 1 | 1 |

0: Unselected,
1: Selected

TABLE 7

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 0 | 1 | 0 | 0 | 1 | 0 | 0 | 1 |
| | C2 = 2 × 100 pF | 0 | 0 | 1 | 0 | 0 | 1 | 0 | 0 | 1 | 0 | 0 |
| | C3 = 3 × 100 pF | 0 | 0 | 0 | 1 | 1 | 1 | 0 | 0 | 0 | 1 | 1 |
| | C4 = 6 × 100 pF | 0 | 0 | 0 | 0 | 0 | 0 | 1 | 1 | 1 | 1 | 1 |

0: Unselected,
1: Selected

TABLE 8

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 1 | 0 | 1 | 0 | 0 | 1 | 0 | 1 |
| | C2 = 2 × 100 pF | 0 | 0 | 1 | 1 | 0 | 0 | 1 | 1 | 1 | 0 | 0 |

TABLE 8-continued

| Output × 100 pF | 0 | 1 | 2 | 3 | 4 | 5 | 6 | 7 | 8 | 9 | 10 |
|---|---|---|---|---|---|---|---|---|---|---|---|
| C3 = 4 × 100 pF | 0 | 0 | 0 | 0 | 1 | 1 | 1 | 0 | 0 | 1 | 1 |
| C4 = 5 × 100 pF | 0 | 0 | 0 | 0 | 0 | 0 | 0 | 1 | 1 | 1 | 1 |

0: Unselected,
1: Selected

TABLE 9

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 1 | 0 | 1 | 0 | 1 | 0 | 1 | 0 |
| | C2 = 2 × 100 pF | 0 | 0 | 1 | 1 | 0 | 0 | 0 | 0 | 1 | 1 | 0 |
| | C3 = 4 × 100 pF | 0 | 0 | 0 | 0 | 1 | 1 | 0 | 0 | 0 | 0 | 1 |
| | C4 = 6 × 100 pF | 0 | 0 | 0 | 0 | 0 | 0 | 1 | 1 | 1 | 1 | 1 |

0: Unselected,
1: Selected

TABLE 10

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 1 | 0 | 1 | 0 | 0 | 1 | 0 | 1 |
| | C2 = 2 × 100 pF | 0 | 0 | 1 | 1 | 0 | 0 | 1 | 0 | 0 | 1 | 1 |
| | C3 = 4 × 100 pF | 0 | 0 | 0 | 0 | 1 | 1 | 1 | 0 | 0 | 0 | 0 |
| | C4 = 7 × 100 pF | 0 | 0 | 0 | 0 | 0 | 0 | 0 | 1 | 1 | 1 | 1 |

0: Unselected,
1: Selected

TABLE 11

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 1 | 0 | 1 | 0 | 1 | 0 | 1 | 0 |
| | C2 = 2 × 100 pF | 0 | 0 | 1 | 1 | 0 | 0 | 1 | 1 | 0 | 0 | 1 |
| | C3 = 4 × 100 pF | 0 | 0 | 0 | 0 | 1 | 1 | 1 | 1 | 0 | 0 | 0 |
| | C4 = 8 × 100 pF | 0 | 0 | 0 | 0 | 0 | 0 | 0 | 0 | 1 | 1 | 1 |

0: Unselected,
1: Selected

TABLE 12

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 0 | 0 | 1 | 0 | 0 | 1 | 0 | 1 |
| | C2 = 2 × 100 pF | 0 | 0 | 1 | 0 | 0 | 0 | 1 | 0 | 0 | 1 | 1 |
| | C3 = 3 × 100 pF | 0 | 0 | 0 | 1 | 0 | 0 | 0 | 1 | 1 | 1 | 1 |
| | C4 = 4 × 100 pF | 0 | 0 | 0 | 0 | 1 | 1 | 1 | 1 | 1 | 1 | 1 |

0: Unselected,
1: Selected

TABLE 13

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 0 | 1 | 0 | 1 | 0 | 1 | 0 | 1 |
| | C2 = 2 × 100 pF | 0 | 0 | 1 | 0 | 0 | 1 | 1 | 0 | 0 | 1 | 1 |
| | C3 = 3 × 100 pF | 0 | 0 | 0 | 1 | 1 | 1 | 1 | 0 | 0 | 0 | 0 |
| | C4 = 7 × 100 pF | 0 | 0 | 0 | 0 | 0 | 0 | 0 | 1 | 1 | 1 | 1 |

0: Unselected,
1: Selected

TABLE 14

| | Output × 100 pF | 0 | 1 | 2 | 3 | 4 | 5 | 6 | 7 | 8 | 9 | 10 |
|---|---|---|---|---|---|---|---|---|---|---|---|---|
| Input | C1 = 1 × 100 pF | 0 | 1 | 0 | 1 | 0 | 1 | 0 | 1 | 0 | 1 | 0 |
| | C2 = 2 × 100 pF | 0 | 0 | 1 | 1 | 0 | 0 | 1 | 1 | 0 | 0 | 1 |
| | C3 = 4 × 100 pF | 0 | 0 | 0 | 0 | 1 | 1 | 1 | 1 | 1 | 1 | 1 |
| | C4 = 4 × 100 pF | 0 | 0 | 0 | 0 | 0 | 0 | 0 | 0 | 1 | 1 | 1 |

0: Unselected,
1: Selected

As to all of features, methods, measures in the instructions disclosed in the invention, in addition to mutually exclusive features, and/or steps, they can be combined in any forms.

Any one of the features disclosed in this instruction (including any of the appended claims, abstract summary and drawings) may be replaced by other equivalents or alternative features with similar purposes. That is, unless specifically described, each of the features is just one example in a series of equivalents or similar features.

The invention is not limited to the previously described specific embodiments. The invention is extended to other applications, any new features or new combination disclosed in this instruction, as well as any steps or a new combination of anyone of new methods or procedures.

The invention claimed is:

1. A capacitance standard box output device, comprising a changeover switch and precision capacitors, wherein:
   the changeover switch is placed in a shield box;
   the shield box has an input terminal and an output terminal;
   the input terminal is connected to the changeover switch and the precision capacitor;
   the output terminal is connected to the changeover switch and outputs the capacitance selected by the changeover switch;
   the selected capacitance is a product of an arbitrary integer value between 0 and 10 and a unit capacitance;
   the precision capacitors are arranged in at least one layer;
   the number of the precision capacitors in the at least one layer is from 4 to 9;
   at least one of the precision capacitors in the at least one layer is one unit capacitance; and
   the capacitance of a second one of the at least one of the precision capacitors in the at least one layer is N times as big as one unit capacitance, wherein N is an integer, and N≥2.

2. The capacitance standard box output device according to claim 1, wherein both the input and output terminals adopt a shielded interface.

3. The capacitance standard box output device according to claim 1, wherein the shield box consists of a metal sheet which is welded.

4. The capacitance standard box output device according to claim 1, wherein:
   the shield box has a partitioning metal board in the middle thereof;
   the partitioning metal board divides the shield box into two shielded rooms, and
   the changeover switch is positioned at the two shielded rooms and connected to two electrodes of a standard capacitance respectively.

5. The capacitance standard box output device according to claim 4, wherein the number of the precision capacitors is four.

6. The capacitance standard box output device according to claim 5, wherein the changeover is a ceramic band switch with a structure in ten layers, and two shielded rooms have five layers respectively.

7. The capacitance standard box output device according to claim 5, wherein the capacitance of four the precision capacitors is 1, 2, 2 and 5 unit capacitances respectively.

8. The capacitance standard box output device according to claim 5, wherein the capacitance of four the precision capacitors is 1, 2, 2 and 6 unit capacitances respectively.

9. The capacitance standard box output device according to claim 5, wherein the capacitance of four the precision capacitors is respectively 1, 1, 3 and 5 unit capacitances respectively.

10. The capacitance standard box output device according to claim 5, wherein the capacitance of four the precision capacitors is 1, 1, 3 and 6 unit capacitances respectively.

11. The capacitance standard box output device according to claim 1, wherein one or several of the precision capacitors are combined in superposition to make up the capacitance of one to ten unit capacitances respectively.

12. The capacitance standard box output device according to claim 2, wherein:
   the shield box has a partitioning metal board in the middle thereof;
   the partitioning metal board divides the shield box into two shielded rooms, and
   the changeover switch is positioned at the two shielded rooms and connected to two electrodes of a standard capacitance respectively.

13. The capacitance standard box output device according to claim 12, wherein the number of the precision capacitors is four.

14. The capacitance standard box output device according to claim 13, wherein the changeover is a ceramic band switch with a structure in ten layers, and two shielded rooms have five layers respectively.

15. The capacitance standard box output device according to claim 3, wherein:
   the shield box has a partitioning metal board in the middle thereof;
   the partitioning metal board divides the shield box into two shielded rooms, and
   the changeover switch is positioned at the two shielded rooms and connected to two electrodes of a standard capacitance respectively.

16. The capacitance standard box output device according to claim 15, wherein the number of the precision capacitors is four.

17. The capacitance standard box output device according to claim 16, wherein the changeover is a ceramic band switch with a structure in ten layers, and two shielded rooms have five layers respectively.

18. The capacitance standard box output device of claim 1, comprising between two and five layers, each of the between two and five layers comprising between four and nine precision capacitors.

19. The capacitance standard box output device of claim 1, comprising between six and ten layers, each of the between six and ten layers comprising between four and nine precision capacitors.

* * * * *